United States Patent [19]

Spigarelli

[11] Patent Number: 5,433,368
[45] Date of Patent: Jul. 18, 1995

[54] SOLDERING SYSTEM

[76] Inventor: Donald J. Spigarelli, 99 Indian Hill Rd., Groton, Mass. 01450

[21] Appl. No.: 974,200

[22] Filed: Nov. 10, 1992

[51] Int. Cl.⁶ .................. B23K 1/012; H05K 3/00
[52] U.S. Cl. .................................. 228/8; 228/46; 228/102; 219/390
[58] Field of Search ............... 228/102, 8, 46, 219; 219/388, 390

[56] References Cited

U.S. PATENT DOCUMENTS

| | | | |
|---|---|---|---|
| 3,882,596 | 5/1975 | Kendziora et al. | 228/200 |
| 4,512,508 | 4/1985 | Pashschöll | 228/180.1 |
| 4,771,929 | 9/1988 | Bahr et al. | 228/102 |
| 4,909,430 | 3/1990 | Yokota | 228/102 |
| 4,934,578 | 6/1990 | Fritsch | 228/6.2 |
| 4,938,410 | 7/1990 | Kondo | 228/180.1 |
| 4,960,972 | 10/1990 | Nakamura et al. | 219/85.12 |
| 5,038,496 | 8/1991 | Mishina et al. | 34/78 |
| 5,066,850 | 11/1991 | Kondo | 219/338 |
| 5,145,100 | 9/1992 | Kondo | 228/219 X |
| 5,158,224 | 10/1992 | Baker et al. | 228/37 |
| 5,203,487 | 4/1993 | Mishina et al. | 228/102 |
| 5,223,290 | 6/1993 | Alden | 426/243 |
| 5,232,145 | 8/1993 | Alley et al. | 228/102 |
| 5,259,546 | 11/1993 | Volk | 228/102 |

Primary Examiner—P. Austin Bradley
Assistant Examiner—Jeanne M. Elpel
Attorney, Agent, or Firm—Weingarten, Schurgin, Gagnebin & Hayes

[57] ABSTRACT

A processing system includes at least one processing chamber, a conveyor disposed through the chamber and a drive unit coupled to the conveyor and intermittently activated by a drive controller for driving the conveyor for a first predetermined interval of time at a preselected one of a plurality of speeds and stopping the conveyor for a second predetermined interval of time. The processing system further includes a temperature control system to provide the processing chamber with a first internal region having a first predetermined temperature and a second internal region having a second predetermined temperature, and one or more temperature sensors disposed to monitor the temperature in at least one predetermined region of the processing chamber.

15 Claims, 4 Drawing Sheets

SOLDERING SYSTEM

BACKGROUND OF THE INVENTION

This invention relates to processing systems and more particularly to incremental conveyor processing systems.

FIELD OF THE INVENTION

As is known in the art, heating systems generally include a chamber through which a continuously moving conveyor belt is disposed. The conveyor belt typically carries a printed circuit board or other object on which a soldering operation, for example, may be performed. The conveyor belt transports the printed circuit board (PC) through the chamber during which time a piece of solder is melted then cooled in a predetermined region of the printed circuit board. Thus, a solder connection is provided on the printed circuit board.

In such continuous conveyor belt soldering systems the time during which the PC board resides in the chamber may be referred to as the residence time and corresponds to that amount of time required for the soldering to be done. This requires that the size and length of the chamber be selected to allow the PC board to remain in the chamber for the requisite residence time. A trade-off is generally made between the speed with which the conveyor moves the PC board through the chamber and the length of the chamber. Thus, one problem with the continuous conveyor belt approach is the size of conventional soldering systems and the speed with which such systems perform their soldering function.

A further problem with this approach is that it is difficult to avoid temperature differentials which occur on the PC board disposed in the chamber. That is, when a PC board enters a heating chamber of a conventional system having a continuously moving conveyor, the leading and trailing edges of the PC board are exposed to different temperatures due to the time delay in conveying the entire PC board into the chamber.

Furthermore, in conventional heating systems undesirable heating gradients exist between different regions of the chamber. Such heating gradients may either damage the objects to be soldered or result in poor solder joints because of a too rapid or a too slow change in temperature. Such heating gradients, therefore, are undesirable.

A further problem with conventional soldering systems is that it is relatively difficult to effectively control the atmosphere quality within the chamber.

SUMMARY OF THE INVENTION

In accordance with the present invention, a processing system includes a chamber, a conveyor disposed through the chamber, and a drive unit coupled to the conveyor for driving the conveyor and a drive controller coupled to the drive unit. The processing system further includes a thermal source disposed in the chamber to provide the chamber with a first internal region having a first predetermined temperature and a second internal region having a second predetermined temperature and a temperature sensor disposed in the chamber about a predetermined internal region of the chamber to monitor an atmosphere temperature in at least one predetermined internal region of the chamber. With this particular arrangement, a processing system to rapidly heat an object without exceeding a predetermined temperature is provided.

The drive controller intermittently activates the drive unit, and thus the drive unit may drive the conveyor. A thermal source controller may be coupled to the thermal source and a temperature controller may be coupled to the temperature sensors. An object to be heated may be disposed on the conveyor and transported into a first region of the chamber. The drive controller may deactivate the drive unit, stopping the conveyor and the object disposed thereon at a preselected location in the chamber. The thermal source may then heat a predetermined region of the object, and the temperature sensing elements may monitor a predetermined region of the object. The respective controllers may each be programmed such that, after a predetermined amount of time or when the temperature sensors detect a predetermined temperature for example, the drive controller actuates the drive unit, consequently starting the conveyor and thus moving the object into a different region of the chamber, or alternatively the conveyor may transport the object out of the chamber.

With the drive controller coupled to the drive unit, the length of the chamber and the overall length of the processing system may be selected to accommodate an object having a predetermined length. Thus, the length of the processing system is not determined by the interrelationships between heating functions and conveyor speed. Rather, the length of the processing system is determined by the length of the object to be processed in the system. Consequently, for an object of a given size the processing system of the present invention provides a significant reduction in the overall system length compared with the length of conventional processing systems. Furthermore, the object to be heated is stationary within the chamber during the heating process. Since the object is stationary, the thermal source may expose the object to uniform heat. In the case where the object is a printed circuit (PC) board, the thermal source may heat the entire PC board or predetermined regions thereof. Thus the heating and sensing is both precise and repeatable. The temperature sensors may provide temperature information to the temperature controllers and the thermal source controllers to thus allow accurate control of the temperature and the change in temperature for a component being soldered to the PC board. That is, it is possible to provide a particular predetermined heating profile (i.e., variable slope of change in temperature versus time) or to provide a particular predetermined heating rate (i.e., constant slope of change in temperature versus time) in the chamber.

Thus the present invention heats the PC board and avoids undesirable heating gradients on the PC board. The drive controller/separate chamber approach provides a heating system having the flexibility to maintain predetermined heating rates of objects in a processing system having an overall length which is significantly less than the length of a conventional continuous conveyor system. Thus, the system of the present invention occupies less room than conventional systems. Furthermore, reduced system size may result in a significant reduction in the power requirements of the system due to lower atmospheric flow rate. Moreover, reduced chamber size may result in a significant reduction in atmosphere flow requirements within the chamber, which may be an important consideration with protective or reactive atmospheres. Reduced system size also permits more effective control of atmosphere quality.

A mask may be disposed over the PC board to provide a technique for selectively reflowing particular solder regions. The selective reflow option permits reflow of solder on preselected portions of the PC board while still maintaining lower temperatures on surrounding portions of the PC board. Since the temperature controllers may provide temperature feedback to the thermal source=controllers, the thermal source may be adjusted to provide a predetermined temperature on a surface of the PC board. Thus the processing system may provide a method for reducing the amount of time needed to develop a particular soldering process for the PC board. That is, conventional solder systems require a disproportionate amount of time to optimize the time/temperature profile of a soldering process because such systems measure the temperature of the environment and calibrate temperature accordingly. In the present invention, the time/temperature profile may be determined by direct measurement of the object, minimizing many of the side effects which may increase the time required for final testing and acceptance of the soldering process. This is particularly true for those PC boards requiring a relatively complex soldering process. A plurality of such chambers, conveyors and controllers may of course be provided and disposed in proximity to one another to provide a processing system having a plurality of segmented conveyors which independently transport objects between each of the chambers.

BRIEF DESCRIPTION OF THE DRAWINGS

The foregoing features of this invention as well as the invention itself may be more fully understood from the following detailed description of the drawings in which.

DESCRIPTION OF THE PREFERRED EMBODIMENTS

Figure 1:
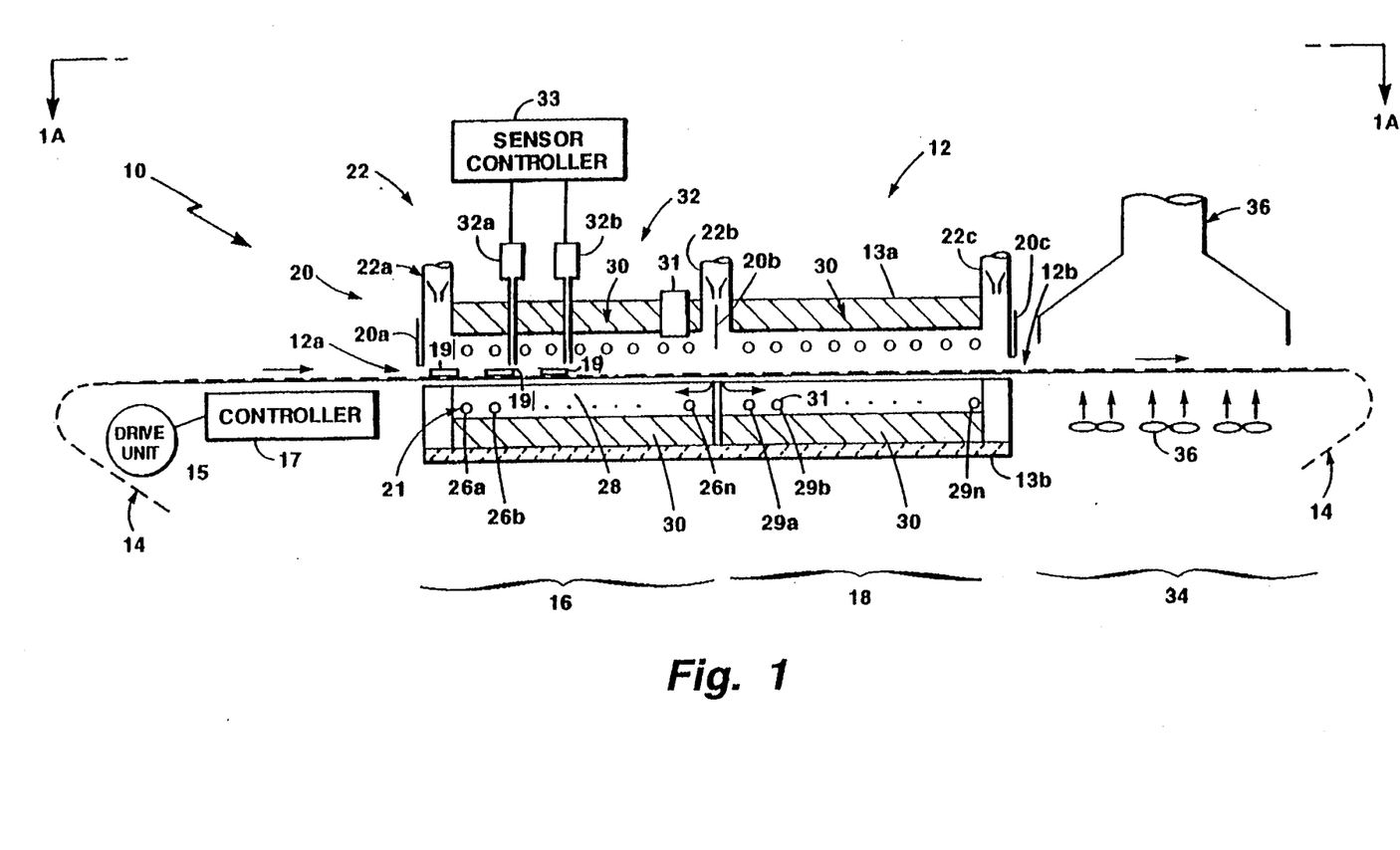
FIG. 1 is a diagrammatical cross-sectional view along a longitudinal axis of a processing system.
Figure 1A:
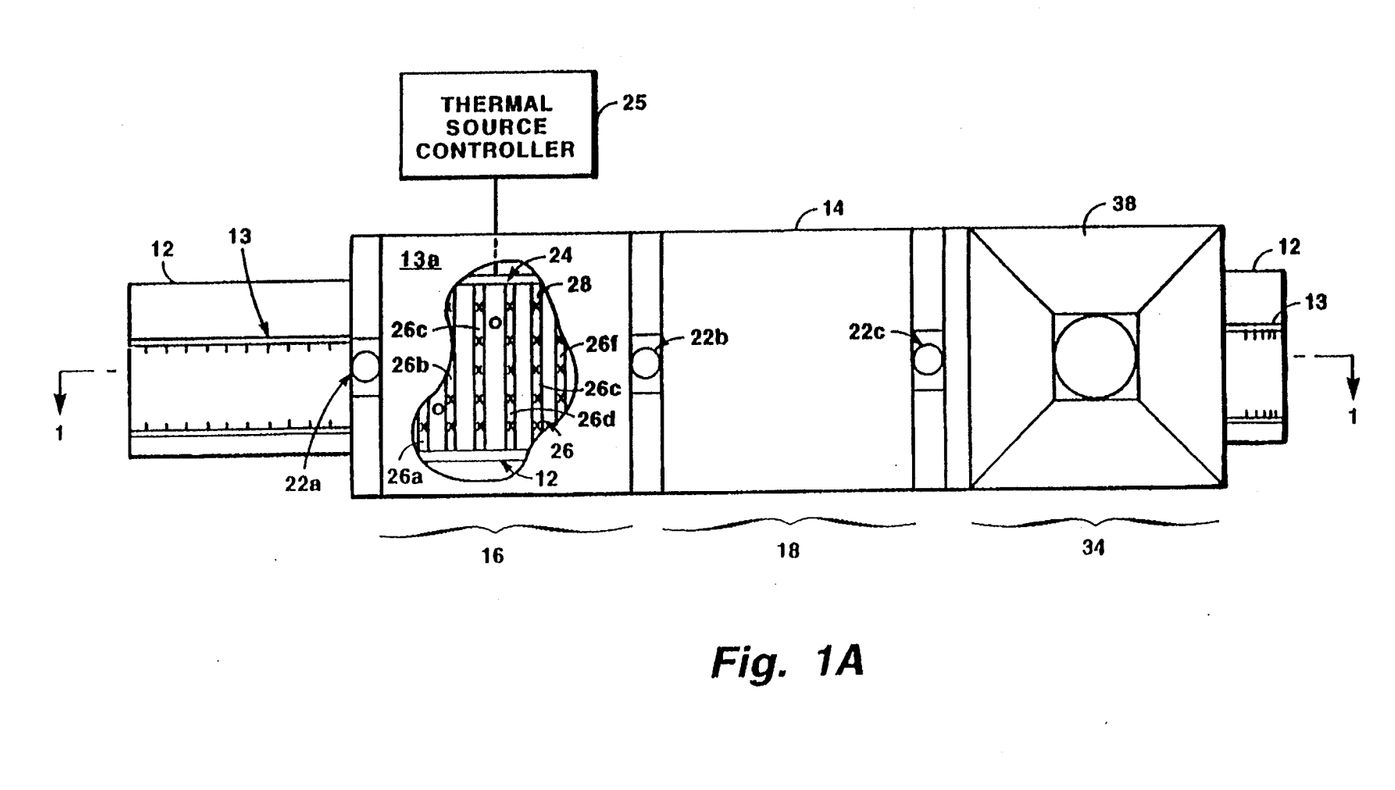
FIG. 1A is a top diagrammatical view of the processing system of FIG. 1.

Referring now to FIGS. 1 and 1A, a processing system 10 includes a processing vessel 12 having a first chamber 16 and a second chamber 18. The first chamber 16 is here designated as a heating chamber and the second chamber 18 is here designated as a cooling chamber. It should be noted that chambers 16 and 18 to be described further hereinbelow may themselves be provided as separate processing vessels. That is processing vessel 12 is here shown having integral chambers 16, 18. Alternatively, each chamber 16, 18 may be provided as a separate, stand-alone processing vessel.

A conveyor 14 is disposed through first and second openings 12a, 12b of the processing vessel 12. The conveyor 14 is driven by a drive unit 15. The conveyor 14 may be provided using belts, walking beams, fingers a plurality of spaced edge holders 19 or edge-type pushers, for example.

The drive unit 15 is capable of driving the conveyor 14 at a preselected one of a plurality of speeds. A drive controller 17 coupled to the drive unit 15 may include a microprocessor (not shown) for example and may be programmed to start and stop the drive unit 15 according to a predetermined set of parameters as will be described further below. Thus, the drive controller 17 may actuate the drive unit 15 and thus drive the conveyor 14 for a first predetermined interval of time. Thereafter, the drive controller 17 may deactuate the drive unit 15 and thus stop the conveyor for a second predetermined interval of time.

Conveyor 14 is here provided as a continuous conveyor; however, it should be noted that the conveyor 14 may be provided as a segmented conveyor having a plurality of sections. That is, in some instances, such as when the heating and cooling chambers 16, 18 are provided as individual, stand-alone chambers (i.e., there exists a plurality of separate chambers) or when the processing times in each chamber are different, it may be advantageous to provide an independent conveyor segment for each of the different chambers. Such independent conveyor segments may of course be independently driven and stopped by separate drive units and drive controllers coupled thereto. Thus, in a processing system having multiple conveyors, each conveyor is independently operable and capable of running at different speeds. This allows the segmented conveyor system to rapidly clear a first object from the cooling chamber 16 and then independently load a second object into the heating chamber 18, for example.

A soldering process may therefore be carried out in the processing vessel 12 having a plurality of integral chambers corresponding to heating or cooling chambers 16, 18 or alternatively the heating and cooling processes may be carried out in two or more separate processing vessels (not shown) with each of such processing vessels having one or more chambers as desired.

The processing vessel 12 optionally includes a plurality of moveable doors generally denoted 20. A first moveable door 20a may close to substantially seal the first opening 12a and thus prevent substantially all of the atmosphere flow from the outside atmosphere to the chamber 16 via the opening 12a.

Similarly, a second optional door 20b may close to separate the first chamber 16 from the second chamber 18. A third optional door 20c may close to substantially seal the second opening 12b and thus prevent substantially all of the atmosphere flow from the outside atmosphere to the chamber 18 via the opening 12b. The doors 20a, 20b, and 20c may be closed simultaneously or individually to substantially seal the chambers 16, 18. Alternatively, other conventional means may also be used to separate and substantially seal the chambers 16 and 18 of the processing vessel 12 from temperature and atmospheric conditions external to the chambers 16 and 18.

The processing vessel 12 further includes a plurality of exhaust vents 22a–22c generally denoted 22. An entry exhaust vent 22a vents undesirable gases from a front portion of the chamber 12. Likewise, a chamber exhaust vent 22b vents undesirable gases from a central portion of the chamber 12, and an exit exhaust vent 22c vents undesirable gases from a rear portion of the chamber 12.

FIG. 1A shows the processing system 10 having a portion of a top wall 13a of the heating chamber 16 removed to reveal a plurality of gas feeder tubes 24 disposed along the heating chamber 16 and coupled here to six gas distribution tubes 26a–26t, generally denoted 26. It should be noted that any number of gas distribution tubes 26 may of course be used. In the heating chamber 16, the gas distribution tubes 26 may have hot gas, for example, flowing therein. The gas distribution tubes 26 are in fluid communication with connector nozzles 28. The hot gas is efficiently coupled from the gas distribution tubes 26 to the connector nozzles 28. The connector nozzles 28 feed the hot gas to the heating chamber 16 to provide the heating chamber 16 having a temperature typically in the range of ambient temperature, to a maximum temperature of 175° centigrade (°C.). Similarly gas distribution tubes 29 carry cooling gas to connector nozzles 31 and subsequently to cooling zone 18.

In place of, or as a supplement to, the gas distribution tubes 26 described above, other thermal sources may also be used in the processing vessel 12. For example, both heated gas and infrared (IR) heating elements 31 may optionally be used to pre-heat top and bottom surfaces of a PC board (not shown). Such IR heating elements may, for example, be of the type described in U.S. Pat. No. 5,060,288 issued Oct. 22, 1991 and assigned to the assignee of the present invention and in co-pending application Ser. No. 660,657 filed Feb. 2, 1992, now U.S. Pat. No. 5,278,938 and assigned to the assignee of the present invention. Both of said references are incorporated herein by reference. Such IR heating elements may direct thermal energy to a particular region of the heating chamber 16.

A thermal source controller 25 is coupled to the gas feeder tubes 24 to control the flow of gases to the chamber 14. The thermal source controller 25 may include a microprocessor for example and thus the gas flow to each heating/cooling chamber may be microprocessor controlled and programmed to provide each heating or cooling zone with a predetermined temperature profile. Other types of controllers may also be used. The flow rate of the gas may be controlled using valves or any other means well known to those of ordinary skill in the art for controlling the flow of gas in a tube. It should also be noted that in the case where IR heating elements are used, such IR heating elements may of course also be individually controlled by the thermal source controller 25.

As mentioned above, the driver controller 17 may be programmed to start and stop the incremental drive unit 15 to move an object to be heated (not shown) within the different regions of each chamber 16, 18 via the conveyor. When the printed circuit board arrives in a predetermined one of the chambers 16, 18, the thermal source controller 25 may perform a selected temperature cycle in the chamber. For example, the thermal source controller may perform a heating or cooling cycle. This temperature cycle may be repeated for each like object transported into the chamber 12. As mentioned above, the heating and cooling elements may of course be independently controlled to correspond to the heating process to be performed on the object. Thus, a first predetermined heating or cooling profile may be selected for a first type of object and a second different predetermined heating or cooling profile may be selected for a second different type of object.

The residence time of a particular object in the processing vessel 12 and more specifically the residence time of the object in the heating or cooling chambers 16, 18 may be selected according to the particular requirements and characteristics of the object.

The top and bottom walls 13a, 13b and similarly the side walls (not shown) of the processing vessel 12 may each have thermally insulating material 30 provided therein to help maintain the desired temperature in each of the chambers 16, 18.

A plurality of sensors 32a, 32b generally denoted 32 are disposed in the heating chamber 16 to monitor the temperature of a predetermined region of the heating chamber 16. The sensors 32 may be provided as temperature sensors which measure the temperature of the atmosphere within the chamber 16. The sensors 32 may also be provided as infrared (IR) sensors which detect the emission of IR energy from a predetermined region of the chamber 16. Furthermore, the sensors 32 may also include a combination of temperature and IR sensors. A temperature sensor controller 33 is coupled to each of the sensors 32. A plurality of such sensors 32 may of course also be disposed in the cooling chamber 18.

The sensors 32 may be positioned such that when the conveyor 14 transports an object (not shown) into the processing vessel 12 and stops such that the object is stationary in a predetermined position in one of the chambers 16 or 18 the sensors 32 are directed toward particular predetermined portions of the object. For example, the sensor 32a may be directed toward a first end of the object, and the sensor 32b may be directed toward a second opposite end of the object. This is particularly true when the sensors are provided as IR sensors having a high degree of directivity and therefore able to be focused at a particular region of the object. Thus, the sensors 32 may provide temperature feedback directly from predetermined regions on the object to the temperature sensor controller 33.

As mentioned above, a predetermined temperature profile may be specified for the object in each of the chambers 16, 18. By using temperature feedback from the object itself via sensors 32, the sensor controller 33 may feed such information to the thermal source controller 25. In response to the temperature information provided from the sensor controller 33 the thermal source controller 25 may adjust, via the IR or gas heating elements, the temperature in a particular one or both of the chambers 16, 18 of the processing vessel 12.

In one possible embodiment, before the object to be heated is transported into the processing vessel 12, one or more thermocouples (not shown) may be disposed on a first surface of the object at predetermined locations. The object may be transported to a predetermined location within the chamber 16, for example, and particular ones of the sensors 32 may be focused on the thermocouples. The thermal source controllers 25 may be programmed to compute the temperature offsets between the thermocouples and the sensors 32, and such temperature offsets may be directly compensated for by the thermal source controller 25. Such temperature offsets may be computed automatically, for example, by directly measuring the temperature values of both the thermocouple and the sensor 32 and comparing the directly measured temperature values of the thermocouples with the temperature values computed by the controller via the sensors 32. Thus the sensors 32 may be calibrated to reduce any temperature measurement errors and therefore accurately provide temperature measurements of the object. After the sensors 32 have been calibrated, the thermal source controller 25 may use the temperature measurements of the temperature sensors 32 to provide the system having self profiling capability.

This self profiling capability provides several advantages and alternatives. First, for any given object, temperature profiles may be controlled based on feedback from the temperature of a particular region of the object. This permits a repeatable heating procedure to be achieved for a plurality of like objects. Second, for a heating operation in which several different types of objects are sequentially fed into the processing vessel 12, the same or different temperature profiles may be used for each type of object, and the thermal source controllers 25 may provide each chamber 16, 18 with a temperature profile selected to correspond to the required temperature profile of the object in that particular chamber 16, 18.

Third, the same or different temperature profiles may be provided for different types of objects. The objects may be fed to the processing vessel 12 at random and the controllers will provide a corresponding temperature profile for each type of object, from measurements of the surface temperature of a first surface of the object itself. This permits a constant temperature profile to be maintained regardless of product mix, or the generation of time/temperature profiles specific to a particular type of object.

Fourth, by providing temperature data from each object to the thermal source controller 25, it becomes possible to record such data for future use. For example, such data may be used to "fine tune" a temperature profile for a particular type of object.

Furthermore, in addition to the sensors 32 sensing temperatures at the surface of the object, additional sensors (not shown) may be disposed to monitor the temperature of certain critical components or objects on the object. These sensors may be coupled to the controller 33 and provide temperature information to the controller. If the temperature of such temperature sensitive components rises to a level which may damage such critical components or devices the controller 33 may provide a warning signal, shut down the heating elements, or communicate to the controller 25 to start the conveyor 14 and transport the object into the cooling chamber 18. Thus, the processing system 10 may prevent temperature sensitive objects from being exposed to and damaged by high temperatures within the processing vessel 12.

Furthermore, since the sensors 32 may monitor different internal portions of the chambers 16, 18 in addition to monitoring different portions of the object within each of the chambers 16, 18, each chamber may be provided having uniform temperatures therein. That is, so-called hot spots and cold spots which are undesirable may be eliminated from the chambers 16 and 18. Such temperature uniformity is made possible by holding the object stationary under the heating elements 28 and sensors 32 and controlling individual regions of heating above and below the object based on the differential temperatures measure from several different regions on the object.

The processing system 10 further includes a cooling region 34 having a plurality of cooling fans 36 which blow air onto the object, for example, and into a cooling hood 38.

The operation of the processing system 10 as a soldering system will now be described. A printed circuit (PC) board (not shown), for example, is disposed on the conveyor 14. A first predetermined region of a first surface of the printed circuit board has solder regions prepared and solder disposed thereon. The drive unit controller 17 activates the drive unit 15, which in turn moves the conveyor 14 which transports the PC board a first predetermined distance into a first predetermined location in the heating zone 16.

The controller 17 subsequently deactivates the drive unit 15 and thus stops the conveyor 14 such that the printed circuit board remains stationary at the first predetermined location in the heating chamber 16. The doors 20a and 20b, which may be operated by the controller 17, close and substantially seal the chamber 16.

The controller 25 provides hot gas to the chamber zone 16 via the gas feeder tubes 26 and connector nozzles 28 which here provide the heating elements 27. The heating elements 27 heat a first predetermined region of the printed circuit board to a temperature capable of melting the solder disposed on the PC board to thus provide solder connections in each predetermined region of the PC board.

The sensors 32 monitor the temperature of a first predetermined region of the PC board and provide temperature information to the sensor controller 33 in the manner described hereinabove. After a first predetermined period of time, the door 20b opens and the controller 17 starts the conveyor 14. The conveyor 14 transports the PC board a second predetermined distance into the cooling chamber 18. The controller 17 stops the conveyor 14 such that the PC board stops at a predetermined location within the cooling chamber 18. The doors 20b and 20c close and substantially seal the cooling chamber 18.

The controller 25 provides cooling gas to predetermined regions of the PC board via the gas feeder tubes 29 and connector nozzles 31. After a second predetermined period of time selected to allow the solder connections to cool, the door 20c opens and the controller 17 starts the conveyor 14. The conveyor 14 transports the PC board out of the cooling chamber 18 a third predetermined distance into the cooling region 34. The controller 17 stops the conveyor 14 such that the PC board stops at a predetermined location in the cooling region 34.

It should be noted that a second PC board may be disposed on the conveyor 14 and transported into the first heating chamber 16 simultaneously with the step of conveying the first PC board into the cooling chamber 18. Thus, the heating of the second PC board in the heating chamber 16 may occur contemporaneously with the cooling of the first PC board in the cooling chamber 18.

The object on which the soldering is to be performed, such as the printed circuit board for example, is stationary during the soldering process. Since the printed circuit boards may be transported to a predetermined position in each of the chambers 16, 18 the sensors 32 may be pre-calibrated and respond the same for each like PC board transported into the processing vessel 12. Thus, the heating of the PC board and sensing of the temperature of the PC board is both precise and repeatable.

Furthermore, by performing solder reflow in a stationary manner, the solder may be selectively reflowed. That is, thermal energy may be directed to specific sites on the PC board where it is desirable to reflow solder while protecting adjacent solder sites from solder reflow.

As will be described further in conjunction with FIGS. 3 and 3A, selective solder reflow may be accomplished for example by disposing a heat shield typically about 0.5 inches above a top surface of the PC board. The heat shield is provided having openings in predetermined portions thereof. Thus the heat shield covers predetermined portions of the PC board while leaving other predetermined portions of the PC board exposed. Controlled atmosphere, at a predetermined temperature, may be introduced into the chamber 16 and directed through the openings in the heat shield via the connector nozzles 28. Thus the heat shield masks certain portions of the PC board from thermal energy while allowing thermal energy to heat exposed portions of the PC board.

Alternatively or in addition to the controlled atmosphere approach, IR heating elements such as those described above for example may provide the requisite thermal energy through the mask openings and thus reflow a predetermined solder site. Thus, the heating elements heat only those preselected exposed regions of the PC board in which solder is to be reflowed. The heat shield/mask also assists in maintaining a high degree of thermal uniformity across the PC board and thus helps eliminate temperature differences between the center and edges of the PC board.

Since the PC board is stationary in the processing vessel 12 the processing vessel 12 may be provided as compact processing vessel. This results in the soldering system using less floor space and providing a product at lower cost. Furthermore, since the processing vessel 12 may be smaller than in continuous conveyor soldering systems, the processing vessel 12 requires a smaller volume of gas to heat and control the atmosphere in the chambers 16 and 18. Therefore the current invention requires less gas to heat and provide good atmospheric control than in conventional systems.

Figure 2:
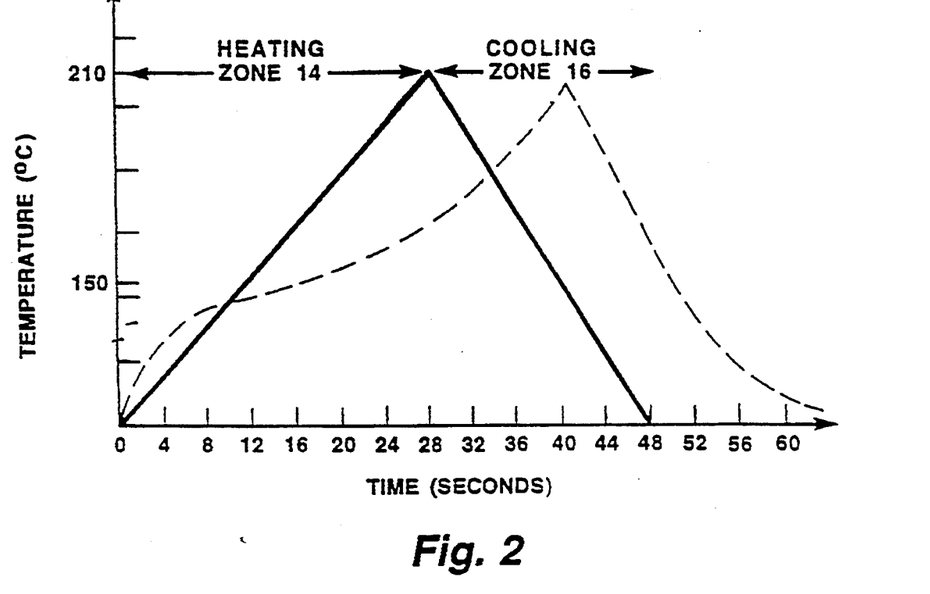
FIG. 2 is a plot of an exemplary temperature profile which may be provided by the processing system of FIG. 1.

Referring momentarily to the graph of FIG. 2, an exemplary plot of temperature in the processing vessel 12 versus time provided by the processing system 10 is illustrated. The processing system 10 here provides a constant slope of 4 degrees per second (4 deg/sec) in the heating chamber 16 to achieve a final uniform temperature $T_0$ here corresponding to 172° F. in the heating chamber 16. Similarly, as shown in FIG. 2 a constant cooling rate may be provided in the cooling chamber 18. In phantom in FIG. 2 is shown the time required in prior art systems to achieve uniform heating at the target temperature $T_0$. Thus, in the present invention the temperature profile is optimized to reduce the time of the heating and cooling cycles.

Referring again to FIGS. 1 and 1A, the soldering process should preferably be performed such that each sequential operation takes less time than the previous operation, i.e., the cooling process in chamber 18 will take less time than the solder reflow operation which takes place in the chamber 16. This allows the overall functionality of the processing system 10 to dominate the sequencing of the incremental drive conveyor 14. For example, it would be desirable for the PC board to cool and exit the cooling chamber 18 before the solder reflow period is complete in the heating chamber 16. In this example, then, the length of time required for the solder reflow cycle, for example, may determine the overall maximum cycle time and, therefore, the production rate of the processing system 10.

The processing system 10 here includes a pair of chambers 16, 18 and a cooling region 34. Each of the sections 16, 18 and 34 are preferably isolated from the others as much as possible in order to permit effective control of the atmosphere quality in each region. This is particularly important in the heating chamber 16 in which solder reflow will occur.

The combination of the compact processing vessel 12 and chambers 16 and 18 coupled with the incremental drive 14 allows effective control of atmosphere quality with minimum gas consumption. In the present invention, by providing the doors 20a-20c to separate and seal the chambers 16 and 18, it is possible to effectively isolate the atmospheres in each of the two chambers 16 and 18, to attain high atmospheric quality and to reduce the atmospheric flow rate. Air, gas or combinations thereof may be introduced to each of the chambers 16, 18 via the gas distribution tubes 26, 29 and connector nozzles 28, 31 to establish an inert or reactive atmospheric environment therein. By controlling the flow of atmosphere it is possible to maintain a different, preselected combination of gases in each of the chambers 16, 18.

Small chambers with low atmosphere flow rates result in reduced amounts of energy used to heat inlet atmosphere to the heating chamber 18. Thus it is believed the small chambers 16 and 18 should significantly reduce the overall energy requirements of the processing system 10 compared to the total energy and energy per board requirements of conventional continuous conveyor heating systems.

Figure 3:
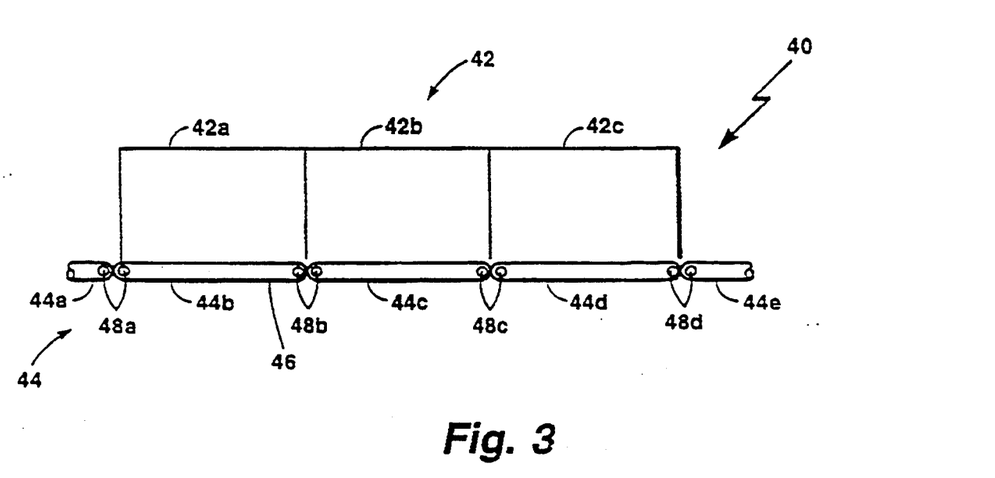
FIG. 3 is a diagrammatical view of a processing system.

Referring now to FIG. 3, a processing system 40 is shown to include a processing vessel 42 having a preheat chamber 42a, a reflow chamber 42b, and a cooling chamber 42c. A segmented conveyor 44 includes here five like segments 44a-44e. Taking conveyor segment 44b as typical of the like conveyor segments 44a-44e, the conveyor segment 44b includes a continuous conveyor belt 46 disposed about a pair of rollers 48a and 48b. The rollers 48a, 48b are selected having relatively small diameters such that a relatively small gap exists between each of the juxtaposed conveyor segments 44a-44e. Thus, an object which is disposed on the first conveyor segment 44a for example, may be smoothly, efficiently and quickly transferred to the adjacent conveyor segment 44b.

Although not shown in FIG. 3, it should be noted that each of the conveyor segments 44a-44e may be controlled by individual controllers and corresponding drive units (not shown). By providing the conveyor 44 having a plurality of conveyor segments 44a-44e, each of which may independently transport an object disposed thereon to an adjacent conveyor segment, objects may be independently moved into and out of the chamber 42. For example, an object disposed in the chamber 42c may be transported out of the chamber 42c via the conveyors 44d and 44e while a different object may be independently transported into the chamber 42a via the conveyor segments 44a and 44b. When such transportation takes place between adjacent conveyor segments, it should be noted that to smoothly and efficiently transport an object from 1 conveyor to an adjacent conveyor it is preferable for the adjacent conveyor segments to be in synchronous movement. Thus, the conveyor segments 44a and 44b, for example, preferably cooperate to properly transport an object into the chamber 42a. Likewise, conveyor segments 44d and 44e preferably cooperate to smoothly transport an object from the chamber 42c out of the chamber. Although not shown in FIG. 3, the processing vessel may of course include the thermal sources and temperature sensors as described above in conjunction with FIG. 1.

The stationary feature provided by having a segmented conveyor offers several advantages. First, it is possible to optimize the performance of each of the heating/cooling functions, allowing each to be performed with some independence from the other, and with independence from conveyor speed. Second, this permits mechanical isolation of the chambers performing each of the functions in order that they may be thermally isolated and that their atmospheres may be independently controlled. Third, with the incremental drive, system length is used only for accommodating a specific object size and is not used to provide a temperature profile. The heating and cooling functions are not linked and, thus, system size is not determined by the inter-relationships between heating functions and conveyor speed, and a significant reduction in overall length is permitted at predetermined production rates.

Feedback between the temperature sensors, each of the controllers and the thermal source allows accurate control of the absolute temperature and change in temperature for the object being processed. That is, it is possible to control and achieve a particular predetermined (i.e. intended) temperature profile (i.e. variable change in temperature versus time) or to control and achieve a particular predetermined heating or cooling rate (i.e. the change in temperature versus time may have a constant slope). Thus undesirable temperature gradients within the chambers are avoided.

Furthermore, the present invention may include feedback from a PC board disposed in the chamber to the heating, cooling or atmospheric control systems of the chamber. That is, the present invention may have each of the controllers coupled together to provide a processing system having closed loop control feedback. Such feedback is provided for example from the temperature sensor controller 33 (FIG. 1) and the thermal source controller 25 being coupled together.

Alternatively a plurality of temperature sensors (not shown) may be disposed on a particular portion of the object being processed and coupled to the temperature controller 33 (FIG. 1). Conventional systems provide no feedback between the object and the heating, cooling or atmospheric control systems of the chamber.

In the present invention each chamber 42a, 42b and 42c may operate in a batch mode tailored to a particular task or requirement. Thus the heating, cooling or atmospheric control systems (not shown) permit precise processing in each chamber.

Since the temperature, movement of objects, atmosphere and residence time in each of the chambers 42a–42c may be independently controlled, the reflow chamber 42b, for example, may be constantly on or heated in a selected one of a plurality of heating or cooling cycles.

Figure 4:
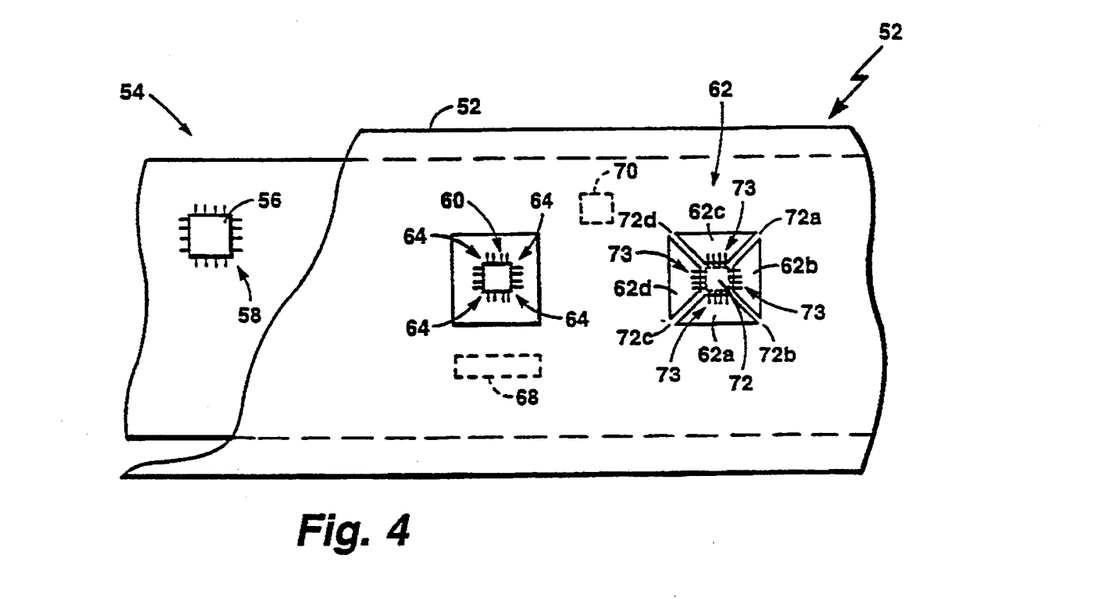
FIG. 4 is a top view of a thermal mask.

Referring now to FIG. 4, a selective solder system 50 includes a thermal mask 52 disposed over a first surface of an object. Here the object is a printed circuit (PC) board 54. A portion of the solder mask 52 has been cut away to reveal a circuit component 56 disposed on a first surface of the printed circuit board 54. The circuit component 56 includes a plurality of leads generally denoted 58 which are soldered to the PC board 54 to thus make electrical connections to the PC board 54.

The thermal mask 52 is provided having a plurality of apertures 60 and 62 disposed therethrough. The aperture 60 is simply provided as a hole here having a square shape. When the mask 52 is disposed over the printed circuit board 54, the hole is aligned over a circuit component 64. Thus, when hot gas or other type of thermal energy is applied from a surface above the thermal mask 52, only the circuit component 64 exposed via the aperture 60 is exposed to the thermal energy. Circuit components 68, 70, here shown in phantom, which are disposed in nearby regions on the PC board, as circuit component 68 and 70, are protected from the thermal energy via the thermal mask 52.

As shown in aperture 62, the solder mask may be provided such that a cover 72 covers the circuit component while leaving the circuit component leads generally denoted 73 exposed. Thus aperture 62 includes four substantially triangular shaped apertures 62a–62d while support arms 72a–72d support the cover 72.

Figure 5:
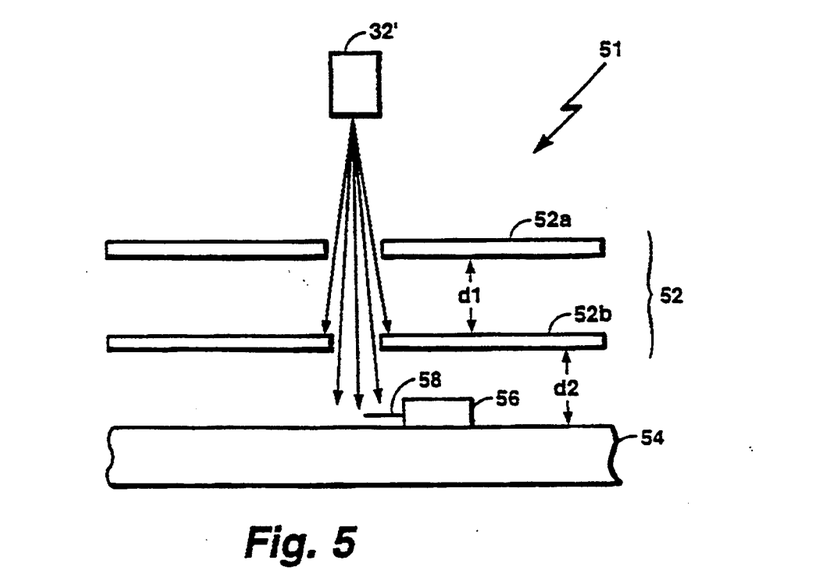
FIG. 5 is a side view of a thermal mask disposed above a printed circuit board.

Referring now to FIG. 5, the thermal mask 52 is shown to include an upper structural wall 52a and a lower structural wall 52b. The distance between the bottom surface of the lower structural wall 52b and the top surface of the printed circuit board 54 is selected such that the thermal energy is effectively collimated and directed to a predetermined region of the circuit board. Here, the thermal energy is directed toward the pin 58 of the circuit component 56 disposed on a first surface of the printed circuit board 54. The distance d1 between the walls 52a and 52b and the distance d2 between the bottom surface of the wall 52b and the top surface of the printed circuit board 54 are selected to provide a predetermined thermal separation. That is, the distances d1 and d2 are selected to provide a predetermined temperature differential between masked and unmasked portions of the printed circuit board.

In the case where the aperture and the mask 52 are provided such that the entire circuit component is exposed, such as aperture 60 (FIG. 4), the thermal energy is preferably collimated by the thermal source rather than collimated by the mask, as shown in FIG. 5. Nevertheless, whether or not the energy is collimated by the thermal source, the mask 52 will still effectively collimate the thermal energy to a predetermined portion of the printed circuit board 54.

Having described preferred embodiments of the invention, it will now become apparent to one of skill in the art that other embodiments incorporating the concepts may be used. It is felt, therefore, that these embodiments should not be limited to disclosed embodiments but rather should be limited only by the spirit and scope of the appended claims.

What is claimed is:

1. A processing system for processing a printed circuit board, the processing system comprising:

a heating chamber having a first end with a first opening therein and a second end with a second opening therein;

a drive unit;

a conveyor, on which the printed board is disposed, coupled to said drive unit and disposed through said chamber;

a drive controller coupled to said drive unit for intermittently activating said drive unit for a first predetermined period of time at a preselected one of a plurality of speeds wherein said drive controller activates said drive unit to move said conveyor such that the printed circuit board disposed on said conveyor is heated at a constant rate in said heating chamber until the printed circuit board achieves a final uniform temperature at the second opening of said heating chamber;

a gas distribution tube for providing gas to said chamber;

a thermal source to provide thermal energy to a predetermined internal region of said chamber; and at least one temperature sensing element disposed in said chamber above a predetermined region of said conveyor to monitor the temperature in a predetermined internal region of said chamber.

2. The processing system of claim 1 wherein said thermal source is provided as a gas heating element coupled to said gas distribution tube.

3. The processing system of claim 1 wherein said thermal source comprises an infrared energy source.

4. The processing system of claim 1 further comprising:

a first controller coupled to said thermal energy source to control the amount of thermal energy provided to said chamber;

a second controller coupled to said drive unit to selectively activate and deactive said drive unit conveyor; and a third controller coupled to said temperature sensors to receive temperature data from said temperature sensors.

5. The processing system of claim 4 further comprising a door coupled to said chamber said door for closing a first one of said first and second openings.

6. The processing system of claim 5 wherein:

said chamber is a first chamber of a plurality of chambers each of such chambers having at least a first one of said first and second ends juxtaposed at least a first one of said first and second ends of an adjacently disposed chamber; and each of said plurality of chambers are provided having a conveyor disposed therethrough.

7. The processing system of claim 6 wherein at least one conveyor comprises a plurality of edge holders disposed on a first surface of said conveyor with a first one of said edge holders disposed on a first side of said conveyor and a second one of said edge holders disposed on a second opposite side of said conveyor.

8. The processing system of claim 7 wherein said edge holders may be spaced apart in a first one of a plurality of distances along the width of said conveyor.

9. A processing system for processing an object, the processing system comprising:

a plurality of chambers each of said chambers having a first end with a first opening therein and a second end having a second opening therein and each of said chambers comprising:

a gas distribution tube for providing gas to said chamber;

a thermal source disposed in said chamber to provide at least one internal region of said chamber with a predetermined temperature; and a temperature sensor disposed in a predetermined internal region of said chamber to monitor a temperature in at least one predetermined internal region of said chamber;

a like plurality of conveyors, each of said conveyors disposed through a corresponding one said plurality of chambers;

a like plurality of incremental drive units, each of said drive units coupled to a corresponding one of said conveyors wherein each of said incremental drive units is capable of independently driving the corresponding conveyor for a first predetermined interval of time at a preselected one of a plurality of speeds and stopping said conveyor for a second predetermined interval of time.

10. The processing system of claim 9 further comprising:

a drive unit controller coupled to at least one of said incremental drive units to control the driving and stopping of said incremental drive unit; and a thermal source controller coupled to each of said thermal sources for controlling the amount of thermal energy provided to the corresponding chamber in which each of said thermal sources are disposed.

11. The processing system of claim 10 wherein said thermal source comprises a first one of:

a gas distribution tube coupled to a gas heating element disposed in a first region of said chamber and coupled to said thermal source controller; and an infrared thermal source disposed in a first region of said chamber and coupled to said thermal source controller, said infrared thermal source for directing thermal energy to a first internal region of said chamber.

12. The processing system of claim 11 wherein:

a first one of said chambers heats at least a portion of the object when the object is disposed therein; and a second one of said chambers cools at least a portion of the object when the object is disposed therein.

13. A solder system comprising:

a chamber having a first end with a first opening herein and a second end with a second opening therein;

a conveyor disposed through said chamber;

an incremental drive coupled to said conveyor for driving said conveyor at a preselected one of a plurality of speeds, wherein said incremental drive is capable of driving said conveyor for a first predetermined interval of time and stopping said conveyor for a second predetermined interval of time;

a gas distribution tube coupled to said chamber for providing gas to said chamber;

a thermal source disposed in said chamber to provide said chamber with a first internal region having a first predetermined gas temperature and a second internal region having a second different predetermined gas temperature; and a heat sensor coupled to said chamber and disposed in said chamber about a predetermined internal region of said chamber to monitor a gas temperature in at least one predetermined internal region of said chamber.

14. The solder system of claim 13 further comprising:

a first controller coupled to said incremental drive to control the driving and stopping of said incremental drive; and a second controller coupled to said thermal source for controlling the distribution of thermal energy to said chamber.

15. The solder system of claim 14 wherein said thermal source comprises:

a gas heating element;

at least one gas distribution tube coupled to said gas heating element; and at least one infrared heating element.

* * * * *